United States Patent [19]
Shimizu et al.

[11] Patent Number: 5,142,492
[45] Date of Patent: Aug. 25, 1992

[54] SEMICONDUCTOR MEMORY DEVICE

[75] Inventors: Mitsuru Shimizu, Sakura; Syuso Fujii, Kawasaki, both of Japan

[73] Assignee: Kabushiki Kaisha Toshiba, Kawasaki, Japan

[21] Appl. No.: 591,948

[22] Filed: Oct. 2, 1990

[30] Foreign Application Priority Data

Oct. 5, 1989 [JP] Japan .................................. 1-260871

[51] Int. Cl.$^5$ .............................................. G11C 13/00
[52] U.S. Cl. ....................................... 365/51; 365/182
[58] Field of Search ................... 365/51, 182, 189.01, 365/206, 207

[56] References Cited
U.S. PATENT DOCUMENTS 4,660,174  4/1987  Takemae et al. ...................... 365/63

Primary Examiner—Terrell W. Fears
Attorney, Agent, or Firm—Banner, Birch, McKie & Beckett

[57] ABSTRACT

A semiconductor memory device is disclosed which comprises a regular row/column memory cell array having blocks obtained by dividing the memory cell array in the column and row directions, a first peripheral circuit irregularly provided between the blocks divided in the column direction, a second peripheral circuit provided between the blocks divided in the row direction and including a first decoder, a third peripheral circuit provided between the first peripheral circuit and the respective block and including a second decoder, and a fourth peripheral circuit provided at the marginal portion of the memory cell array and including bonding pads and input protection circuit.

15 Claims, 4 Drawing Sheets

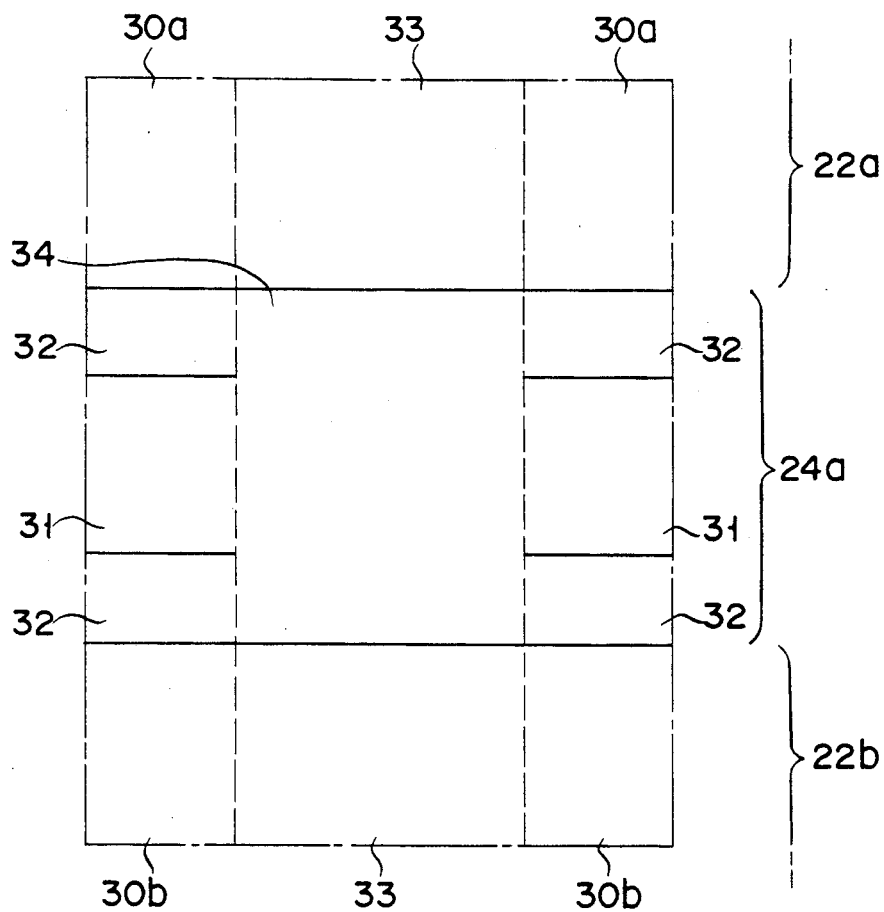
F I G. 4
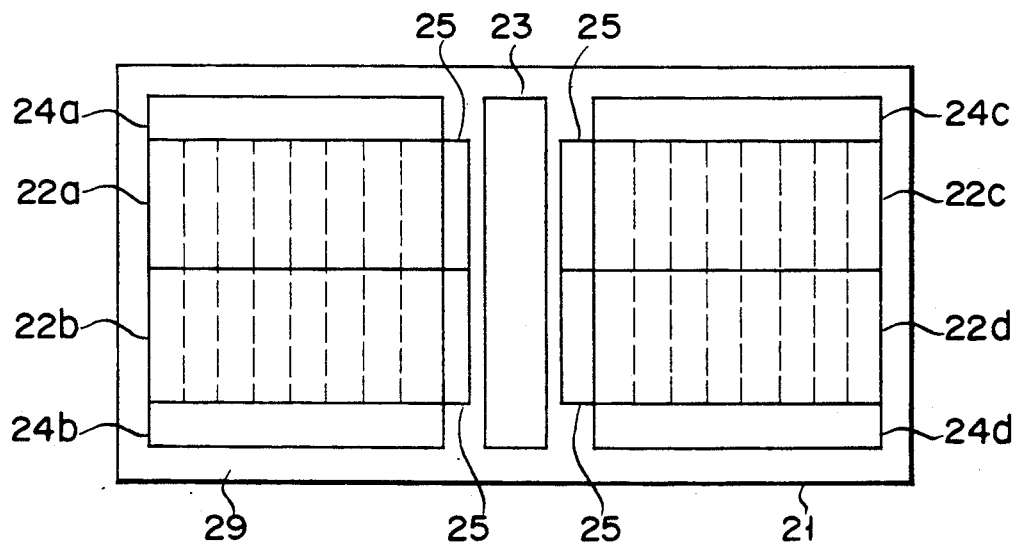
F I G. 5

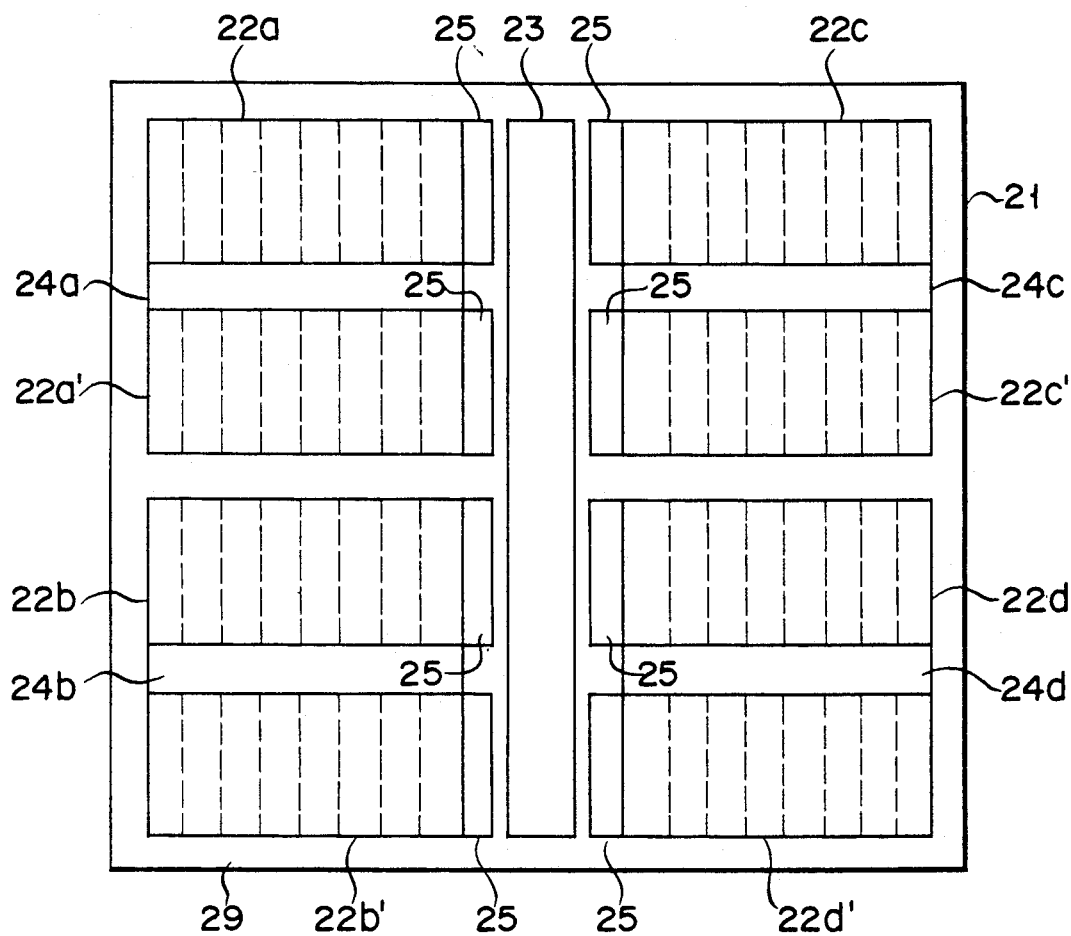
F I G. 6

SEMICONDUCTOR MEMORY DEVICE

BACKGROUND OF THE INVENTION

1. Field of the Invention

The present invention relates to a semiconductor memory device and, in particular, an improvement in a chip layout of a memory cell array.

2. Description of the Related Art

A conventional semiconductor memory device, such as a dynamic RAM (hereinafter referred to as a DRAM) and static RAM (hereinafter referred to as SRAM), has a chip layout as shown in FIG. 1.

A memory cell array area 12 is formed at the central area of a semiconductor chip 11. An area 13 other than a peripheral circuit area, bonding pad area and input protection circuit, is formed at an outer marginal portion of the memory cell array 12. A row decoder 14 is formed relative to a row direction of the memory cell array area 12 and a column decoder 15 is formed relative to the column direction of the memory cell array area 12.

The chip layout of the DRAM or SRAM is broadly divided into the memory cell array area 12 and the rest, that is the area 13, of the chip layout. The memory cell array area 12 includes memory cell arrays regularly arranged relative to a word line (WL) or bit line (BL), decoders for selecting the memory cell arrays, sense amplifier for amplifying data supplied from the memory cell array, and so on. The area 13 includes an irregular peripheral circuit which is not formed for each WL and BL, and so on.

An increase in size of the memory cell array area 12 is caused due to an increase in capacity of memory. In a DRAM or SRAM of the aforementioned chip layout, there is a large increase in resistance and capacitance at a location of WL and BL. That is, a large increase in the resistance and capacitance leads to a signal delay on WL and BL and a further increase in charging/discharging current $I_{BL}$ on BL.

In connection with a signal delay on WL and BL, let it be assumed that the connection length l of WL and BL is doubled due to an increase in size of, for example, a memory cell array. In this case, the resistance R ($\propto$ l) is doubled at WL and BL and the capacitance C ($\propto$ l) is doubled there. Since the signal delay time td is proportional to the resistance R and capacitance C, the signal delay at WL and BL is increased by a factor of 4. Stated in another way, when the connection length l is increased by a factor of n, then a signal transmission is delayed by a factor of $n^2$.

In connection with an increase in the charging/discharging current $I_{BL}$ at BL, let it be assumed that, for example, a capacitance $C_B$ is doubled at BL. In this case, the charging/discharging current $I_{BL}$ is doubled at BL because it is proportional to the capacitance $C_B$. That is, $$I_{BL} = \frac{Q}{t_{RC}} = \frac{CV}{t_{RC}} = \frac{C_B \times SA \text{ number} \times V}{t_{RC}}$$

$$I = I_{BL} + I_{peri}$$

where $t_{RC}$ denotes a cycle time; Q, an amount of charge; V, a voltage; SA number, the number of sense amplifiers; I, an operation current; and $I_{peri}$, a dissipation current at the peripheral circuit area.

As will be appreciated from the above, a factor-of-n increase in the capacitance $C_B$ at BL results in a factor-of-n increase in the charging/discharging current $I_{BL}$. It is to be noted that an increase in the charging/discharging current $I_{BL}$ serves additively as an operation current I.

In this way, a signal delay at WL and BL prevents achievement of a high-speed semiconductor memory device and causes an operation error at a subsequent circuit. This problem is common to all the connection lines irrespective of WL and BL.

Further, an increase in the charging/discharging current $I_{BL}$ exerts a greater influence on the characteristic of the device because 60 to 70% of the operation current I is governed by the charging/discharging current $I_{BL}$.

It is known that, if the memory cell array area 12 is located at the central area of a semiconductor chip with the rest of the chip, that is the area 13, arranged as a peripheral area, the peripheral circuit blocks increase in number. The increase in the number of the peripheral circuit blocks increases a dissipation current $I_{peri}$ there and hence an operation current I correspondingly increases, adversely affecting the characteristic of the device.

SUMMARY OF THE INVENTION

It is accordingly the object of the present invention to provide a semiconductor memory device which can be achieved as a high-speed unit having decreased power dissipation despite an increase in capacity of its memory.

According to the present invention there is provided a semiconductor device comprising:

a regular row/column memory cell array having four blocks obtained by dividing the memory cell array in the column and row directions with the respective two located in a regular array;

a first peripheral circuit provided in an irregular fashion between the blocks divided in the column direction of the regular row/column memory cell array;

a second peripheral circuit provided between adjacent blocks divided in the row direction of the regular row/column cell array and including a first decoder;

a third peripheral circuit provided in the column direction between the first peripheral circuit and the respective adjacent block and including a second decoder; and a fourth peripheral circuit provided at an outer marginal portion of the memory cell array and including bonding pads and input protection circuit.

According to another embodiment of the present invention, a semiconductor memory device is provided, comprising:

a regular row/column memory cell array having eight blocks obtained by dividing the memory cell array in the column and row directions with the respective four located in a regular array in the column direction;

a first peripheral circuit formed in an irregular fashion between the blocks divided in the column direction of the regular row/column memory cell array;

a second peripheral circuit provided between a respective pair of blocks divided in the row direction of the regular row/column cell array and including a first decoder;

a third peripheral circuit provided in the column direction between the first peripheral circuit and the respective block and including a second decoder; and a fourth peripheral circuit provided at an outer marginal portion of the memory cell array, including an area between the adjacent pairs of blocks, said fourth peripheral circuit including bonding pads and input protection circuit.

According to another embodiment, a semiconductor memory device is provided, comprising:

a regular row/column memory cell array having an l×m number (l, m: a natural number) of blocks obtained by dividing the memory cell array in the column and row directions corresponding to l and m, respectively;

a first peripheral circuit provided in an irregular fashion between the blocks divided in the column direction of the regular row/column memory cell array;

a second peripheral circuit provided between a respective pair of blocks divided in the row direction of the regular row/column cell array and including a first decoder;

a third peripheral circuit provided in the column direction between the first peripheral circuit and the respective block and including a second decoder; and a fourth peripheral circuit provided at an outer marginal portion of the memory cell array, including an area between the adjacent pairs of blocks, said fourth peripheral circuit including bonding pads and input protection circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is an enlarged view showing a peripheral circuit including an RDC; and

FIGS. 5 and 6, each, show a semiconductor memory device according to another embodiment of the present invention.

Detailed Description of the Preferred Embodiments

Figure 1:
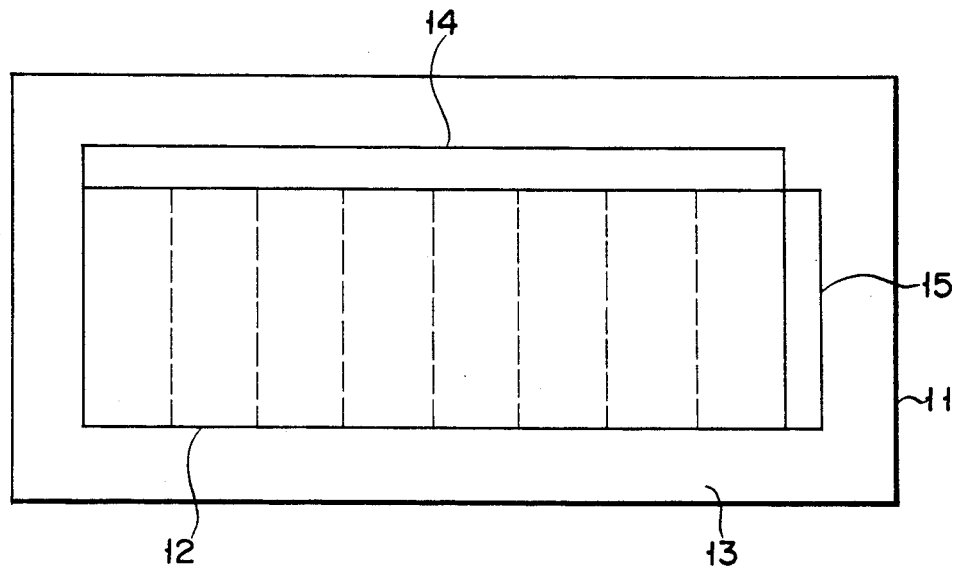
FIG. 1 is a plan view showing a chip layout pattern showing a conventional semiconductor apparatus.

One embodiment of the present invention will be explained below with reference to the accompanying drawings. Like reference numerals are employed to designate like parts or elements throughout the drawings and further explanation is omitted for brevity's sake FIG. 2 shows the chip layout of a semiconductor memory device according to one embodiment of the present invention.

Figure 3:
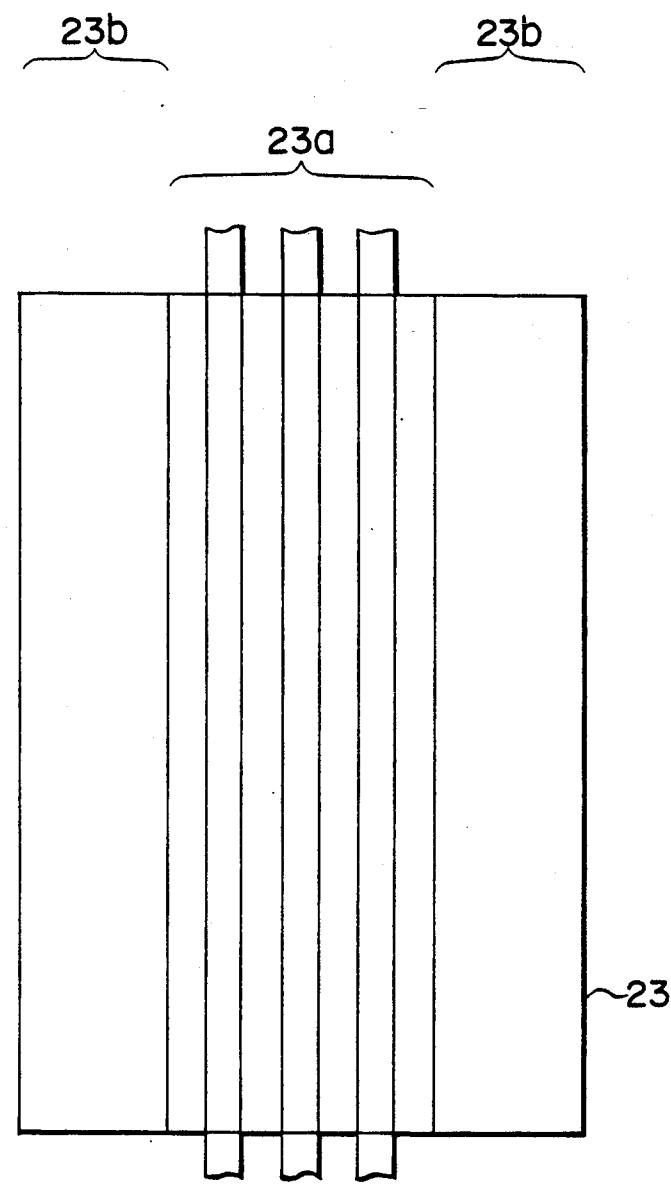
FIG. 3 is an enlarged view showing an irregular peripheral memory circuit 23 in the semiconductor device of FIG. 2.

A row/column memory cell array is formed, as a regular array, at the central area of a semiconductor chip 21. The regular memory cell array has four blocks obtained by dividing the memory cell array in the row and column directions with the respective two located as upper and lower blocks, that is, with blocks 22a and 22b and blocks 22c and 22d, located relative to an irregular peripheral circuit (first peripheral circuit) 23. As shown, for example, in FIG. 3, the peripheral circuit 23 includes a bus line 23a composed of a group of signal lines and a peripheral circuit block 23b provided at each side of the bus line 23a. The signal lines are connected to a row decoder (RDC). Peripheral circuits (second peripheral circuits) 24a and 24c, including an RDC (first decoder), are formed one between the blocks 22a, 22b in the memory cell array and one between the blocks 22a, 22c in the memory cell array in the row direction of the memory cell array. The peripheral circuit 24a is shared by the adjacent blocks 22a and 22b in the memory cell array and the peripheral circuit 24c is shared by the adjacent blocks 22c and 22d. A peripheral circuit (third peripheral circuit) 25, including a column decoder (CDC), is formed between the peripheral circuit 23 and each of the respective blocks 22a, . . . , 22d in the memory cell array.

Figure 2:
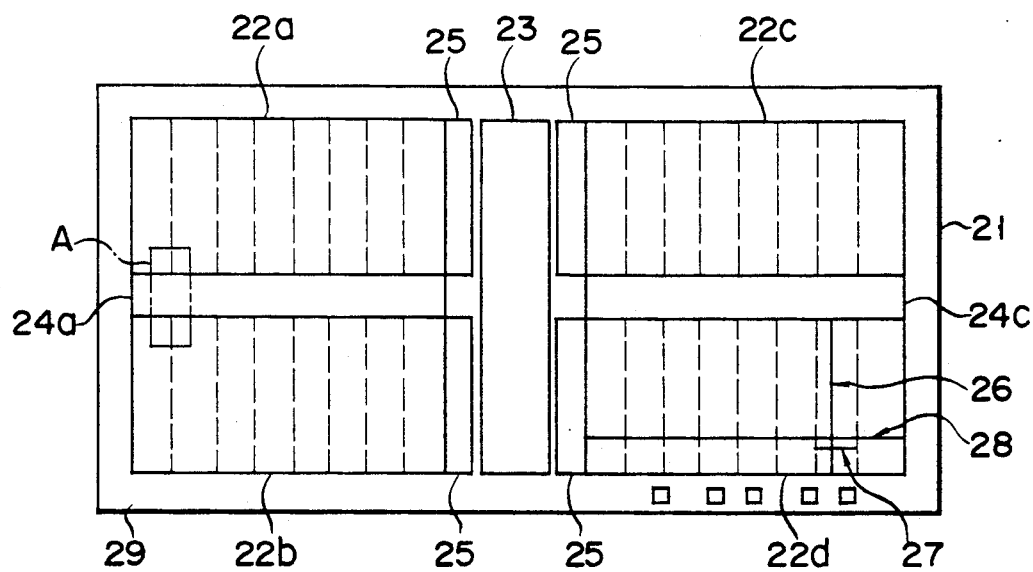
FIG. 2 is a plan view showing a chip layout pattern of a semiconductor memory device according to one embodiment of the present invention.

The respective blocks 22a, . . . , 22d are each divided by $2^n$ (n: a natural number) in the column direction and, in the case of the embodiment shown in FIG. 2, divided into eight sections (minimal memory units) as indicated by dotted lines in FIG. 2. WL 26 and BL 27 are arranged, relatively in the column and row directions, for the sections of the respective blocks. A column select line (CSL) 28 is arranged relative to BL 27 such that it extends through the memory cell array area. Further, a peripheral circuit (fourth peripheral circuit) 29, including bonding pads and input protection circuit, is formed at the marginal portion of a semiconductor chip, that is, at the peripheral portion of the memory cell array. The peripheral circuit 29 may include an irregular peripheral circuit as required.

FIG. 4 is an enlarged view, as indicated by A in FIG. 1, showing the peripheral circuit area 24a.

A circuit (row decoder) 31 for selecting an address is provided between the sections 30a, 30a on one hand in the block 22a and the sections 30b, 30b in the block 22b on the other hand and shared by the adjacent sections 30a and 30b. A circuit 32 for driving the WL is formed, for every section (30a, 30b), between the circuit 31 and the sections 30a, 30b. A sense amplifier, gating circuit and so on are formed between the neighboring sections 30a, 30a and between neighboring sections 30b, 30b. An address select circuit, redundancy circuit, fuse and so on can be provided at a location surrounded by the sections 30a and 30b.

In the aforementioned memory cell array, four blocks 22a to 22d are provided with the circuit 23, as well as the peripheral circuits 24a, 24c including the RDC, arranged between the corresponding blocks 22a, . . . , 24c. It is thus possible to decrease the number of memory cells to be connected to the WL and to make the connection lengths of the WL and BL short. The peripheral circuit 24a is shared by the blocks 22a and 22b in the row direction and the peripheral circuit 24c is shared by the blocks 22c and 22d in the row direction. It is, therefore, possible to commonly use the signal connection lines for the RDC and to reduce the size of the semiconductor chip.

As shown in FIG. 5, peripheral circuits 24a, . . . , 24d, including an RDC, may be provided relative to blocks 22a, . . . , 24d, respectively, in which case a problem is undesirably involved due to a resistance, chip area, capacitance, etc., of control signal lines for RDC.

Respective blocks 22a, ..., 22d in the memory cell array are divided by $2^n$ (n: a natural number) to provide sections 30a, 30b. In this way, the row can be selected in units of the sections 30a, 30b, ensuring further division of the WL. This arrangement shortens the WL, BL, signal connection lines, etc., thus making it possible to reduce the connection capacitance, resistance, etc. Further, the resultant arrangement obviates the need to provide any extra circuit blocks and hence contributes much to achieving a high-speed device of less dissipation power. As in the case of a 16M DRAM, in order to achieve a high-capacity memory and improve a connection delay of the WL and BL as well as the characteristic of the device, such as the charging/discharging current of the BL, it is very advantageous to broadly divide the memory cell array into four blocks.

Various changes or modifications of the present invention can be made without restricting the present invention to the preceding embodiment.

FIG. 6 shows a chip layout of a semiconductor device in which four divided blocks are further divided in the row direction of a memory cell array to provide eight blocks as shown in the figure.

Stated in another way, the memory cell array is divided at the middle column line into two segments with the respective segment composed of four blocks (22a, 22a', 22b, 22b' and 22c, 22c', 22d, 22d'). An irregular peripheral circuit (first peripheral circuit) 23 is provided between the blocks 22a, 22a', 22b, 22b' at one side and the blocks 22c, 22c', 22d, 22d' at the other side of the memory cell array.

A peripheral circuit 24a including an RDC (first decoder) is provided between the blocks 22a and 22a'; a peripheral circuit 24b including an RDC, between the blocks 22b and 22b'; a peripheral circuit 24c including an RDC, between the blocks 22c and 22c'; and a peripheral circuit 24d including an RDC, between the blocks 22d and 22d'. These peripheral circuits 24a to 24d are each shared by the adjacent blocks. A peripheral circuit (third peripheral circuit) 25 including a CDC (second decoder) is provided between the peripheral circuit 23 and each of the blocks 22a to 22d and 22a' to 22d'.

The respective blocks 22a to 22d and 22a' to 22d' in the memory cell array are each are divided by $2^n$ (n: a natural number) into sections in the column direction of the memory cell array (in the present embodiment, each is divided into eight sections as indicated by the dotted line in FIG. 6). A peripheral circuit (fourth peripheral circuit) 29 including a bonding pad area and input protection circuit is provided at the marginal portion of the semiconductor chip 21, that is, at that peripheral portion of the memory cell array which includes an area between the adjacent pairs of blocks 22a, 22a'; 22b, 22b'; 22c, 22c'; and 22d, 22d'.

In this embodiment, the memory cell array includes the eight blocks 22a, ..., 22d and 22a' to 22d', and an irregular peripheral circuit 23 and peripheral circuits 24a to 24d including an RDC are provided between the adjacent ones of these blocks as shown in FIG. 6. It is thus possible to obtain the same advantage as set out in connection with the embodiment of FIG. 1.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A semiconductor memory device comprising:
   a regular row/column memory cell array having four blocks obtained by dividing the memory cell array in the column and row directions;
   a first peripheral circuit provided between the blocks divided in the column direction of the regular row/column memory cell array;
   a second peripheral circuit provided between adjacent blocks divided in the row direction of the regular row/column cell array and including a first decoder;
   a third peripheral circuit provided in the column direction between the first peripheral circuit and the respective adjacent block and including a second decoder; and
   a fourth peripheral circuit provided at an outer marginal portion of the memory cell array and including bonding pads and input protection circuit.

2. The semiconductor memory device according to claim 1, wherein the respective block in said regular row/column memory cell array is divided by $2^n$ (n: a natural number) into sections, the section constituting a minimal memory array unit.

3. The semiconductor memory device according to claim 1, wherein said first decoder is shared by adjacent blocks in said memory cell array.

4. The semiconductor memory device according to claim 1, wherein said first decoder is composed of a row decoder.

5. The semiconductor memory device according to claim 1, wherein said second decoder is composed of a column decoder.

6. A semiconductor memory device comprising:
   a regular row/column memory cell array having eight blocks obtained by dividing the memory cell array in the column and row directions with four of the eight blocks being arranged in the column direction;
   a first peripheral circuit formed between the blocks divided in the column direction of the regular row/column memory cell array;
   a second peripheral circuit provided between a respective pair of blocks divided in the row direction of the regular row/column cell array and including a first decoder;
   a third peripheral circuit provided in the column direction between the first peripheral circuit and the respective block and including a second decoder; and a fourth peripheral circuit provided at an outer marginal portion of the memory cell array, including an area between the adjacent pairs of blocks, said fourth peripheral circuit including bonding pads and input protection circuit.

7. The semiconductor memory device according to claim 6, wherein a respective block in said memory cell array is divided by $2^n$ (n: a natural number) into sections, the section constituting a minimal memory unit.

8. The semiconductor memory device according to claim 6, wherein said first decoder is shared by adjacent blocks in said memory cell array.

9. The semiconductor memory device according to claim 6, wherein said first decoder is composed of a row decoder.

10. The semiconductor memory device according to claim 6, wherein said second decoder is composed of a column decoder.

11. A semiconductor memory device comprising:
- a regular row/column memory cell array having an l×m number (l, m: a natural number) of blocks obtained by dividing the memory cell array in the column and row directions corresponding to l and m, respectively;
- a first peripheral circuit provided in an irregular fashion between the blocks divided in the column direction of the regular row/column memory cell array;
- a second peripheral circuit provided between a respective pair of blocks divided in the row direction of the regular row/column cell array and including a first decoder;
- a third peripheral circuit provided in the column direction between the first peripheral circuit and the respective block and including a second decoder; and
- a fourth peripheral circuit provided at an outer marginal portion of the memory cell array, including an area between the adjacent pairs of blocks, and fourth peripheral circuit and including bonding pads and input protection circuit.

12. A semiconductor memory device according to claim 11, wherein the respective block in said regular row/column memory cell array is divided by $2^n$ (n: a natural number) into sections, the section constituting a minimal memory unit.

13. The semiconductor memory device according to claim 11, wherein said first decoder is shared by adjacent blocks in the memory array.

14. The semiconductor memory device according to claim 11, wherein said first decoder is composed of a row decoder.

15. The semiconductor memory device according to claim 11, wherein said second decoder is composed of a column decoder.

* * * * *